United States Patent [19]

Hareyama

[11] 4,087,758

[45] May 2, 1978

[54] REFERENCE VOLTAGE SOURCE CIRCUIT

[75] Inventor: Kyuichi Hareyama, Tokyo, Japan

[73] Assignee: Nippon Electric Co., Ltd., Tokyo, Japan

[21] Appl. No.: 707,015

[22] Filed: Jul. 20, 1976

[30] Foreign Application Priority Data

Jul. 25, 1975 Japan ................................ 50-91201

[51] Int. Cl.[2] ............................................ H03F 3/45

[52] U.S. Cl. ...................................... 330/261; 330/69; 330/108; 330/260

[58] Field of Search .................. 330/69, 108, 260, 261

[56] References Cited

U.S. PATENT DOCUMENTS 3,757,239 9/1973 Langan ......................... 330/30 D X 3,972,006 7/1976 Ruegg ............................. 330/108 X

*Primary Examiner*—Lawrence J. Dahl

[57] ABSTRACT

A reference voltage source circuit includes two transistors having their collectors connected to the input terminals of a differential amplifier. The transistor terminals are connected in common, and to the output of the amplifier.

In accordance with one aspect of the present invention, variable resistance structure is employed to control the collector currents in the transistor to maintain the temperature-output voltage transfer characteristic at a low level. In accordance with another aspect of the present invention, the transistor supply may depend from the amplifier output to reduce the influence of supply voltage variations on the regulated output potential.

9 Claims, 5 Drawing Figures

REFERENCE VOLTAGE SOURCE CIRCUIT

DISCLOSURE OF THE INVENTION

The present invention relates to a reference voltage source circuit, and more particularly to an integrated reference voltage source circuit for generating a reference voltage stabilized with respect to variations in temperature.

Recently a temperature-independent, stable reference voltage has been needed for use in electronic devices, e.g., digital-analog converters. In such applications a reference voltage source is expected to provide an output voltage with a temperature coefficient, i.e., a variation with temperature, controlled to a value within ±50 PPM/° C. A reference voltage source circuit comprising a Zener diode and a transistor has heretofore been known, in which the positive temperature coefficient of the Zener diode is compensated by a negative coefficient of the forward transistor voltage. This approach, however, is not practical since it is extremely difficult to control the temperature coefficient of a reference voltage within ±50 PPM/° C because Zener diodes are not always consistent quality. In addition, Zener diodes exhibit an inferior noise characteristic.

Another prior art approach uses a silicon energy bandgap for a reference voltage source in the form of a monolithic integrated circuit. Again, this approach is impractical since values of resistors formed on a monolithic chip by the diffusion of impurities deviate due to the diffusion process, resulting in variations in the output voltage of the silicon bandgap voltage source circuit and in temperature coefficient. This has made it difficult to control the temperature coefficient to a value within ±50 PPM/° C. One solution to this problem has been to use thin-film resistors. However, the resistance values have had to be precisely adjusted by LASER trimming or like techniques, thus increasing production costs considerably.

It is therefore an object of the present invention to provide a reference voltage source which can readily be fabricated into a monolithic integrated circuit.

It is another object of the invention to provide a reference voltage source circuit capable of compensating for deviation in resistance values of resistors formed in monolithic integrated circuit, and thus generating an output reference voltage with a minimum temperature coefficient.

It is another object of the invention to provide a reference voltage source circuit suited for digital-analog converters.

A silicon energy bandgap reference voltage source circuit to be improved by the present invention comprises a differential amplifier, a pair of transistors having their bases connected in common and collectors respectively connected to different input terminals of the differential amplifier, and load resistors connected to the collectors of the transistor pair, respectively, in which the transistors are supplied with collector currents through the load resistors and the output of the differential amplifier is coupled with the common base junction of the transistors. In accordance with a feature of the invention, collector currents of the transistors are adjusted by a variable resistor such that the sum of the transistors and α-times a difference voltage $\Delta V_{BE}$ between the voltages $V_{BE}$ of the pair of transistors (α being a constant, positive number) be equal to a silicon energy bandgap voltage. An output reference voltage of this circuit is equal to the silicon energy bandgap voltage, i.e., the sum of $V_{BE} + \alpha \cdot \Delta V_{BE}$, where the common base junction is directly connected to the output of the differential amplifier. Where the base common junction is connected to the output of the amplifier through a resistive voltage dividing circuit, the output of the reference voltage circuit is larger than the silicon energy bandgap voltage by a ratio determined by the voltage division circuit.

Further objects, features and advantages of the invention will become more apparent from the following description taken in conjunction with the accompanying drawings, wherein.

Figure 1:
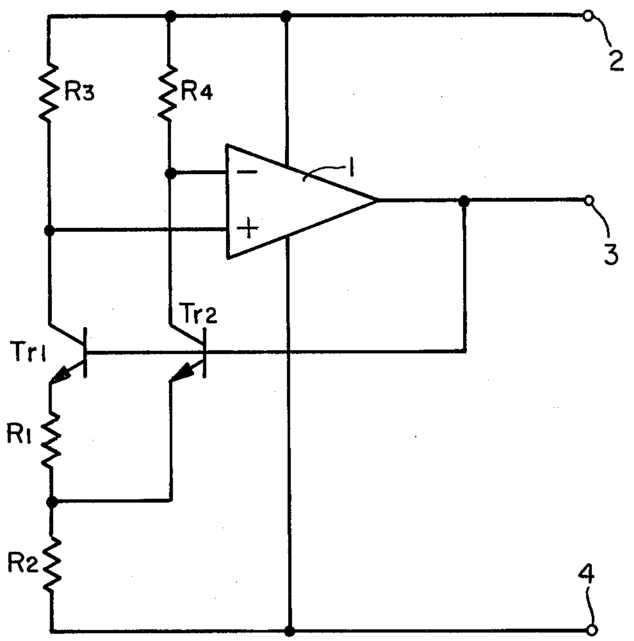
(PRIOR ART) FIG. 1
FIG. 1 is a circuit diagram showing a conventional silicon energy bandgap reference voltage source circuit.

With reference to FIG. 1, there is schematically shown a prior art silicon energy bandgap reference voltage source circuit described in "A Simple Three Terminal IC Bandgap Reference" by A. P. Brokaw, IEEE Journal Solid-State Circuits, Vol. SC-9, No. 6, December 1974. In FIG. 1, the bases of a pair of NPN transistors $T_{r1}$ and $T_{r2}$ are connected in common, and a voltage at an output terminal 3 of a differential amplifier 1 is fed back to this common base. The collectors of the transistors $T_{r1}$ and $T_{r2}$ are respectively connected to a noninverting input and an inverting input of a differential amplifier 1 and further connected to a positive terminal 2 of a power source through load resistors $R_3$ and $R_4$, respectively. The transistor $T_{r1}$ has its emitter connected to a negative terminal 4 of the power source, for example to a ground potential, through resistors $R_1$ and $R_2$. The transistor $T_{r2}$ has its emitter connected to the connection point of the resistors $R_1$ and $R_2$. The differential amplifier 1 is supplied with power through the power terminals 2 and 4.

The sum of the base-emitter voltage $V_{BE}$ of the transistor $T_{r2}$ and the voltage being α-times (α: a positive constant) a voltage across the resistor $R_1$, i.e., the difference $\Delta V_{BE}$ between the base-emitter voltages $V_{BE}$ of the transistors $T_{r1}$ and $T_{r2}$, is generated at the output terminal 3. This output voltage is made to be equal to the silicon energy bandgap voltage $V_{GO}$ and thus a temperature-independent reference voltage is provided.

The output voltage $V_{OUT}$ is given by Eq. (1) below, where the load resistors $R_3$ and $R_4$ are assumed to be the same in resistance value.

$$V_{OUT} = V_{BE}(T_{r2}) + 2\frac{R_1}{R_2} \cdot \Delta V_{BE} \tag{1}$$

Here, α is equal to $2R_2/R_2$. In Eq. (1), the difference voltage $V_{BE}$ is expressed as $$\Delta V_{BE} = (KT/q) \cdot \ln(I_{s1}/I_{s2} \cdot I_2/I_1) \tag{2}$$

where "K" denotes the Boltzmann's constant, $q$ a unit charge, "T" the absolute temperature, $I_{s1}$ and $I_{s2}$ saturation currents of transistors $T_{r1}$ and $T_{r2}$, and $I_1$ and $I_2$ collector currents of transistors $T_{r1}$ and $T_{r2}$.

By selecting the output voltage $V_{OUT}$ as defined in Eqs. (1) and (2) to be equal to the silicon bandgap voltage $V_{GO}$ (÷ 1.205 V), the temperature drift of the output voltage $V_{OUT}$ can be reduced. In practice, the output voltage $V_{OUT}$ varies due to deviations in resistance values of the resistors $R_1$ to $R_4$ formed on a monolithic chip. This has made it extremely difficult to control the temperature coefficient to a value within ±50 PPM/° C.

Figure 2:
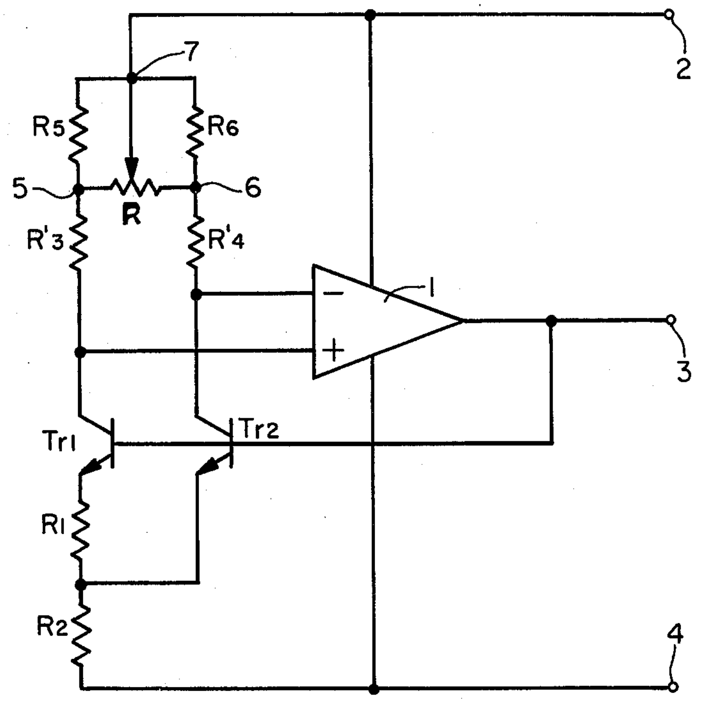
FIG. 2 is a circuit diagram illustrating one embodiment of the present invention.

FIG. 2 is a circuit diagram showing one embodiment of the present invention. Like constituent components are indicated by the identical reference numerals in FIGS. 1 and 2. Instead of the load resistors $R_3$ and $R_4$ in FIG. 1, collector load resistors $R_3'$ and $R_5$, and $R_4'$ and $R_6$ are used for transistors $T_{r1}$ and $T_{r2}$ respectively, as shown in FIG. 2. In other words, the transistor $T_{r1}$ has its collector connected to a positive power terminal 2 through the resistors $R_3'$ and $R_5$, and the transistor $T_{r2}$ has its collector also connected to the positive power terminal 2 through the resistors $R_4'$ and $R_6$. In addition, a variable resistor R is connected across a junction point 5 between the resistors $R_3'$ and $R_5$ and a junction point 6 between the resistors $R_4'$ and $R_6$. A variable tap 7 of the variable resistor R is connected to the power terminal 2. The resistors $R_3'$, $R_4'$, $R_5$ and $R_6$ are formed together with the transistors $T_{r1}$ and $T_{r2}$ on a monolithic semiconductor integrated circuit chip with terminals 5, 6 and 7 among others, while the variable resistor R is attached to this monolithic chip by being electrically connected to the terminals 5, 6 and 7 of the chip. In this circuit, the temperature coefficient of the output voltage can be controlled to a value smaller than a specific value in the following manner.

An output voltage $V_{OUT}$ at a terminal 3 in FIG. 2 is given as $$V_{OUT} = V_{BE}(T_{r2}) + \frac{R_1}{R_2}\cdot\frac{KT}{q}\cdot\left(\ln\frac{I_{s1}}{I_{s2}}\cdot\frac{I_2}{I_1}\right) + \frac{R_{L1}}{R_{L2}}\cdot I_1\cdot R_1 \quad (3)$$

where $I_1$ and $I_2$ denote collector currents of $T_{r1}$ and $T_{r2}$, $I_{s1}$ and $I_{s2}$ saturation currents of $T_{r1}$ and $T_{r2}$, and $R_{L1} = R_3' + R_5//R_x$ and $R_{L2} = R_4' + R_6//R_y$ ($R_x$: resistance across terminals 5 and 7 of the variable resistor R, and $R_y$: resistance across terminals 7 and 6 of the variable resistor R).

The forward junction voltage $V_{BE}$ at a temperature "T" is given as:

$$V_{BE} = V_{GO}(1-T/T_o) + V_{BE}(T_o)T/T_o + \eta KT/q\cdot \ln\cdot T_o/T + KT/q\cdot \ln\cdot T/T_o \quad (4)$$

where $V_{BE}(T_o)$ denotes the value of $V_{BE}$ at a temperature $T_o$. Substituting Eq. (4) for Eq. (3) and substituting the condition $dV_{OUT}/dT = O$ at $T = T_o$ for Eq. (3), $$V_{OUT} = V_{GO} + \frac{(\eta-1)KT}{q} - \frac{(\eta-1)KT}{q}\cdot\frac{\ln T}{T_o} - A:T\cdot\frac{d}{dT}\left(\frac{R_{L2}}{R_{L1}}\right) \quad (5)$$

Substituting the condition $\Delta T = T - T_o$ for Eq. (5), $$V_{OUT} = \underbrace{V_{GO} + (\eta-1)\cdot\frac{KT_O}{q}}_{\text{1st term}} - \underbrace{\frac{1}{2}(\eta-1)\cdot\frac{KT_O}{q}\cdot\left(\frac{\Delta T}{T}\right)^2}_{\text{2nd term}} - \underbrace{A\cdot F(R_x, R_y)\cdot\theta\cdot T_o\left(1+\frac{\Delta T}{T_o}\right)}_{\text{3rd term}} \quad (6)$$

where $\eta$ denotes a device constant, "A" a factor coefficient, $F(R_x, R_y)$ a function depending on $R_x$ and $R_y$, and $\theta$ a difference in temperature coefficients difference between the fixed resistors ($R_3'$, $R_4'$, $R_5$ and $R_6$) and the variable resistor R. In Eq. (6), the third term shows a temperature drift which accounts for the variable resistor R. The temperature coefficient on the third term can be adjusted to a value within ±10 PPM/° C by suitably selecting the values of A, R, $R_3'$, $R_4'$, $R_5$ and $R_6$. The temperature coefficient value of the output voltage $V_{OUT}$ depends on the second and third terms of Eq. (6) when the output voltage of the differential amplifier 1 which depends on Eqs. (2) and (3) is made equal to the first term $\{V_{GO} + (\eta-1)\cdot KT_o/q\}$ of Eq. (6) at the ordinary temperature ($T = T_o$) by adjusting the variable resistor R. This temperature coefficient comes within ±10 PPM/° C at a temperature in the range of $T_o \pm 30°$ C. As previously mentioned, $V_{GO}$ is nearly equal to 1.205 V and $(\eta-1)\cdot KT_o/q$ is about 0.02 V. Hence, by making the output $V_{OUT}$ of the differential amplifier 1 approximately equal to the silicon energy bandgap voltage $V_{GO}$ at the ordinary temperature by means of the variable resistor R, it is possible to realize a reference voltage source circuit having a temperature coefficient controlled to a value about within ±20 PPM/° C.

Figure 3:
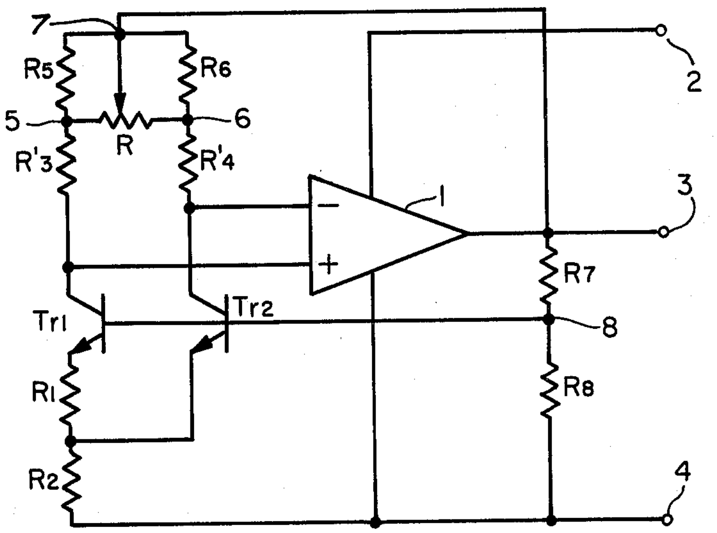
FIG. 3 is a circuit diagram depicting a second embodiment of the present invention.

Referring to FIG. 3, there is shown a circuit diagram of another embodiment of the invention. Like constituent components are indicated by the identical reference numerals in FIGS. 2 and 3. This embodiment differs from the one shown in FIG. 2 in the voltage supply to the load resistors $R_5$ and $R_6$ and to the variable tap 7 of the variable resistor R, as well as in the base input supply to the transistors $T_{r1}$ and $T_{r2}$. The common terminal of the resistors $R_5$ and $R_6$, and the variable tap 7 are connected to the output terminal 3, which is grounded through resistors $R_7$ and $R_8$. The bases of the transistors $T_{r1}$ and $T_{r2}$ are commonly connected to the junction point 8 between the resistors $R_7$ and $R_8$. In this circuit, when the voltage at the junction point 8 is $V_{GO}$, the output voltage $V_{OUT}$ at the output terminal 3 is $V_{GO}\cdot(R_7 + R_8)/R_8$. This constant voltage $V_{OUT}$ is supplied to the collector load resistors of the transistors $T_{r1}$ and $T_{r2}$. As a result, the supply voltage rejection ratio (i.e., variations in output voltage at terminal 3 for variations in supply voltage) can be improved and the output voltage $V_{OUT}$ can be arbitrarily determined by suitably selecting $R_7$ and $R_8$. Thus, as in the embodiment shown in FIG. 2, a reference voltage source circuit minimally affected by temperature variations can be realized.

Figure 4:
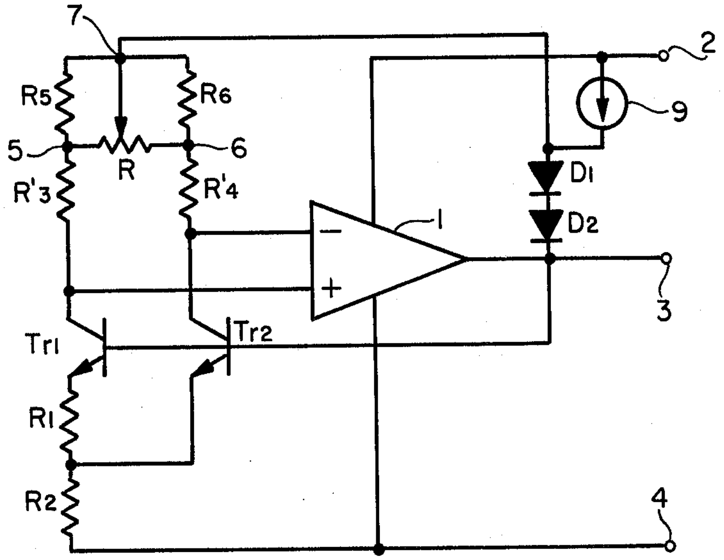
FIG. 4 is a circuit diagram showing a third embodiment of this invention.

Referring to FIG. 4, there is shown a circuit diagram of another embodiment of the invention. Again, like constituent components are indicated by the identical reference numerals in FIGS. 2 and 4. This circuit differs from the one shown in FIG. 2 in the voltage supply to the collector load resistors $R_5$ and $R_6$ and to the tap 7 of the variable resistor R. The common terminal of the resistors $R_5$ and $R_6$ and the variable tap 7 are connected in common to the positive power terminal 2 through a current source 9 and also to the output terminal 3 through level shifting diodes $D_1$ and $D_2$. In this embodiment, the level shifting diodes are connected in series in two stages. Alternatively, the level shifting diodes may be installed in the desired stages according to the voltage supplied to the power terminal 2. In this embodiment also, the supply voltage rejection ratio is improved because a constant voltage provided from the constant reference voltage $V_{GO}$ clamped by the level shifting diodes is supplied to the collector load resistors of the transistors $T_{r1}$ and $T_{r2}$.

Figure 5:
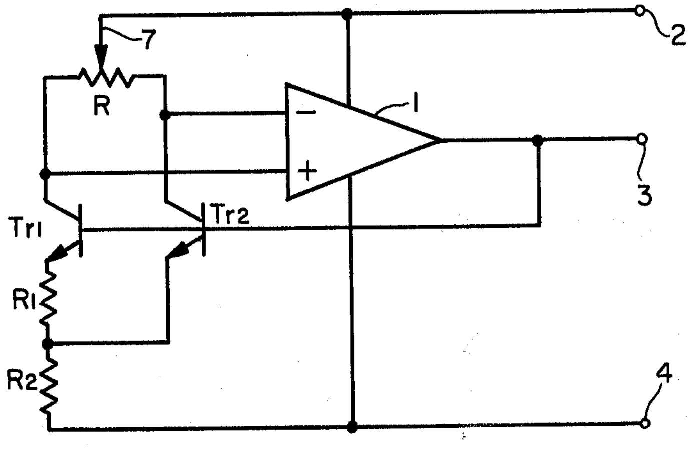
FIG. 5 is a circuit diagram showing still another embodiment of the invention.

Referring to FIG. 5, there is shown a circuit diagram of another embodiment of the invention. Like constituent components are indicated by the identical reference numbers in FIGS. 2 and 5. This FIG. 5 circuit differs from the one shown in FIGS. 2 in the collector load resistor part of the transistors $T_{r1}$ and $T_{r2}$. The fixed resistors $R_3'$, $R_4'$, $R_5$ and $R_6$ of FIG. 2 are omitted. The transistor $T_{r1}$ has its collector connected to one end of the variable resistor R, and the transistor $T_{r2}$ has its collector connected to the other end thereof. The tap 7 of the variable resistor R is connected to the positive power terminal 2. In this circuit, the resistance value of the variable resistor R between the collector of $T_{r1}$ and the tap 7 corresponds to $R_{L1}$ in Eqs. (3), (4), (5) and (6) described with reference to FIG. 2, and the resistance value of the variable resistor R between the collector of $T_{r2}$ and the tap 7 corresponds to $R_{L2}$ in the same equations. Thus this circuit can also generate a reference voltage with a small temperature drift as in the circuit shown in FIG. 2.

According to the invention, as has been described above, an output reference voltage with a minimum temperature coefficient can be obtained. The reference voltage source circuit of the invention is therefore highly suited for digital-analog converters and the like. Furthermore, the invention obviates the need for intricate adjustment of the resistance values of the transistor load resistors such as by LASER trimming, thus permitting the circuit of the invention to be fabricated into a monolithic IC except for the variable resistor. Although the disclosed embodiments employ NPN transistors, it is apparent that PNP transistors may be used instead of the NPN transistors. Also, instead of the variable resistor R, a fixed resistor whose resistance value has been adjusted for a specific one may be used.

While several preferred embodiments of the invention and particular modifications thereof have been described, it is to be understood that numerous variations may occur to those skilled in the art without departing from the true spirit of the invention.

What is claimed is:

1. A reference voltage source circuit comprising: a differential amplifier having input terminals and an output terminal; a pair of transistors having bases connected in common and collectors respectively connected to different input terminals of said differential amplifier; load resistors connected to said transistor collectors; means for supplying said transistors with collector currents through said respective load resistors; means for coupling the output terminal of said differential amplifier to the common base junction of said transistors; and adjusting means for adjusting said collector currents of said transistors so that the sum of the base-emitter forward junction voltage $V_{BE}$ of one of said pair of transistors and $\alpha$-times a difference voltage $\Delta V_{BE}$ between said voltages $V_{BE}$ of said pair of transistors, $\alpha$ being a positive constant, is equal to a silicon energy bandgap voltage; wherein $\beta$-times said silicon energy bandgap voltage, $\alpha$ being a constant at least equal to one, is an output reference voltage of said reference voltage source circuit.

2. A reference voltage source circuit as claimed in claim 1, wherein said output of said differential amplifier is directly connected to said common base junction, and the value of $\beta$ is one.

3. A reference voltage source circuit as claimed in claim 1, wherein said coupling means comprises a resistor, one terminal of said resistor being connected to said output terminal of said differential amplifier and the other terminal of said resistor being connected to said common base junction of said transistors, the value of $\beta$ therefore exceeding one.

4. A reference voltage source circuit as claimed in claim 1, wherein said adjusting means comprises a variable resistor.

5. A reference voltage source circuit as claimed in claim 4, wherein one terminal of said variable resistor is connected to an intermediate tap of said load resistor of one of said transistors, another terminal of said variable resistor is connected to an intermediate tap of said load resistor of another one of said transistors, and the variable tap of said variable resistor is connected to said collector current supplying means.

6. A reference voltage source circuit comprising: a differential amplifier having input terminals and an output terminal; a pair of transistors having bases connected in common and collectors respectively connected to different input terminals of said differential amplifier; load resistors connected to said transistor collectors; means for supplying said transistors with collector currents through said respective load resistors; means for coupling the output terminal of said differential amplifier to the common base junction of said transistors and adjusting means for adjusting said collector currents of said transistors so that the sum of the base-emitter forward junction voltage $V_{BE}$ of one of said pair of transistors and $\alpha$-times a difference voltage $\Delta V_{BE}$ between said voltages $V_{BE}$ of said pair of transistors, $\alpha$ being a positive constant, is equal to a silicon energy bandgap voltage; wherein $\beta$-times said silicon energy bandgap voltage, $\beta$ being a constant at least equal to one, is an output reference voltage of said reference voltage source circuit, wherein said coupling means comprises a resistor, one terminal of said resistor being connected to said output terminal of said differential amplifier and the other terminal of said resistor being connected to said common base junction of said transistors, the value of $\beta$ therefore exceeding one, wherein said collector current supplying means is connected to said output terminal of said differential amplifier.

7. A reference voltage source circuit comprising: a differential amplifier having input terminals and an output terminal; a pair of transistors having bases connected in common and collectors respectively connected to different input terminals of said differential amplifier; load resistors connected to said transistor collectors; means for supplying said transistors with collector currents through said respective load resistors; means for coupling the output terminal of said differential amplifier to the common base junction of said transistors and adjusting means for adjusting said collector currents of said transistors so that the sum of the base-emitter forward junction voltage $V_{BE}$ of one of said pair of transistors and $\alpha$-times a difference voltage $\Delta V_{BE}$ between said voltages $V_{BE}$ of said pair of transistors, $\alpha$ being a positive constant is equal to a silicon energy bandgap voltage; wherein $\beta$-times said silicon energy bandgap voltage, $\beta$ being a constant at least equal to one, is an output reference voltage of said reference voltage source circuit, wherein said adjusting means comprises a variable resistor, wherein said collector currents supplying means comprises a current source, and output voltage level shifting means for connecting said output terminal of said differential amplifier to said variable tap of said variable resistor.

8. A reference voltage source circuit comprising: a differential amplifier having differential input terminals and an output; a pair of transistors having bases connected in common and collectors respectively connected to differential input terminals of said differential amplifier; means for connecting the output of said differential amplifier to the common base junction of said pair of transistors; means for supplying collector currents for said transistors; and a variable resistor connected between said collectors of said transistors, a variable tap of said variable resistor being connected to said collector current supplying means, and said variable resistor adjusting said collector currents of said transistors so that the sum of a voltage $\alpha$-times the difference between base-emitter junction voltages of said pair of transistors, ($\alpha$ being a constant positive number) and a base-emitter junction voltage of one of said transistors equals a silicon energy bandgap voltage; wherein a voltage $\beta$-times said silicon energy bandgap voltage is an output reference voltage of said reference voltage source circuit, ($\beta$ being a constant of at least one).

9. A reference voltage source circuit as claimed in claim 1 wherein said differential amplifier, said transistors, said load resistors, and said coupling means are formed on a monolithic semiconductor integrated circuit chip, and wherein said adjusting means is attached to said monolithic chip.

* * * * *